(12) United States Patent
Melanson et al.

(10) Patent No.: US 8,970,413 B1
(45) Date of Patent: Mar. 3, 2015

(54) LOW POWER ANALOG-TO-DIGITAL CONVERTER FOR SENSING GEOPHONE SIGNALS

(71) Applicant: Cirrus Logic, Inc., Austin, TX (US)

(72) Inventors: John L. Melanson, Austin, TX (US); Rahul Singh, Austin, TX (US); Prashanth Drakshapalli, Austin, TX (US); Dale Brummel, Spicewood, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 13/799,323

(22) Filed: Mar. 13, 2013

Related U.S. Application Data

(60) Provisional application No. 61/705,520, filed on Sep. 25, 2012.

(51) Int. Cl.
*H03M 3/00* (2006.01)
*H03M 1/00* (2006.01)

(52) U.S. Cl.
CPC .................................... *H03M 1/002* (2013.01)
USPC ......................................... 341/143; 341/155

(58) Field of Classification Search
USPC ................................................. 341/143, 155
See application file for complete search history.

(56) References Cited

U.S. PATENT DOCUMENTS

| | | | |
|---|---|---|---|
| 3,685,047 A | 8/1972 | Sherer | |
| 4,706,226 A | 11/1987 | Houghtaling | |
| 5,172,345 A * | 12/1992 | van der Poel | 367/178 |
| 5,896,101 A | 4/1999 | Melanson | |
| 6,101,864 A * | 8/2000 | Abrams et al. | 73/1.01 |
| 6,806,756 B1 * | 10/2004 | Manlove et al. | 327/307 |
| 7,230,555 B2 * | 6/2007 | Dolazza et al. | 341/143 |
| 7,518,954 B2 | 4/2009 | Hagedoorn | |
| 2004/0252585 A1 | 12/2004 | Smith | |
| 2013/0194117 A1 * | 8/2013 | Goulier et al. | 341/143 |

OTHER PUBLICATIONS

A.S. Badger, A.D. Beecroft, A. Stienstra, "Seismic data recording: the limiting component", SEG conference (1990).

* cited by examiner

*Primary Examiner* — Khai M Nguyen
(74) *Attorney, Agent, or Firm* — Jackson Walker L.L.P.

(57) ABSTRACT

A low power analog-to-digital converter (ADC) may sense current output of a geophone instead of voltage. The output of the geophone may be terminated through a resistor into a virtual ground of an integrator, which may be located inside a current mode delta-sigma analog-to-digital converter. The integrator may have a current mode or a charge mode feedback. Thus, the geophone may experience constant or substantially constant impedance terminated into a virtual ground. This approach may eliminate an instrumentation amplifier from a geophone sensing circuit, while still allowing for accurate sensing of geophone signals. The instrumentation amplifier is a major current consumer from the signal path, so its elimination may significantly reduce power consumption. The instrumentation amplifier may be eliminated, at least in part because of the provision of the resistance into a virtual ground of an integrator of the delta-sigma ADC.

26 Claims, 5 Drawing Sheets

LOW POWER ANALOG-TO-DIGITAL CONVERTER FOR SENSING GEOPHONE SIGNALS

CROSS-REFERENCE TO RELATED APPLICATIONS

The present application claims priority from Provisional U.S. Patent Application No. 61/705,520, filed on Sep. 25, 2012, and incorporated herein by reference.

FIELD OF THE INVENTION

The field of representative embodiments of this disclosure relates to methods, apparatuses, or implementations concerning low power, high resolution Analog-to-Digital Converters (ADCs). Applications include, but are not limited to, those concerning geophones and geophone signals.

BACKGROUND

A geophone is a device for converting ground movement (displacement) into voltage, which may be recorded at a recording station. The deviation of this measured voltage from the base line is called the seismic response and is analyzed to determine structure of the earth. Geophones are used by seismologists to study the earth, and are also used in oil and gas exploration, to map underground structures and locate oil and gas deposits.

Geophones may also be used for other purposes, including alarm systems and military applications, where ground motion may detect movement of people or vehicles. In addition, geophones have a very broad market in data acquisition technology. The accelerometers used in earth movement monitoring are large 0 to 10 Hz geophones and are distributed all over the globe in autonomous-nodal stations to study and forewarn of disastrous earth movements. Smaller versions are required in buildings in areas like Japan to study the infrastructure when earthquakes and aftershocks occur. There are many per floor and permanently deployed. Large machinery like turbines may require geophones to monitor the bearings, armatures, and the like for cracks/wear and for proactive maintenance.

Geophones have historically been passive analog devices and originally comprised a spring-mounted magnetic mass moving within a wire coil to generate an electrical signal. In more recent times, geophones have utilized a wire coil connected to a spring or springs, which allow the coil to move over a stationary magnet. Geophones are based on an inertial mass (proof mass) suspended from a spring. They function much like a microphone or loudspeaker, with a magnet surrounded by a coil of wire. In modern geophones the magnet is fixed to the geophone case, and the coil represents the proof mass.

The frequency response of a geophone is that of a damped sinusoid, fully determined by corner frequency (typically around 10 Hz) and damping (typically 0.707). Since the corner frequency is proportional to the inverse root of the moving mass, geophones with low corner frequencies (<1 Hz) become impractical. It is possible to lower the corner frequency electronically, at the price of higher noise and cost.

Traditionally, geophones have been passive analog devices, outputting a low-voltage, (e.g., substantially 3 V) low-current (e.g. substantially 3.3 mA or less) analog signal, which requires amplification as well as conversion into digital form using an analog to digital converter (ADC). Traditional geophone sensors measured voltage at the geophone, rather than current. As the signal is a very low power signal, it may tend to be noisy and difficult to measure, as the sensor needs to detect small variations in voltage. In a traditional ADC solution, an instrumentation amplifier amplifies the output voltage of the geophone, prior to conversion into digital form by the ADC. The amplified output is then digitized by a high-resolution ADC. The instrumentation amplifier is needed to sense the geophone signals, as the signals are weak and noisy. A parallel resistor may provide for a known load. However, such amplifiers may require additional power, which may not be available, particularly for battery-operated and remote installations.

Smith, published U.S. Patent Application 2004/0252585 dated Dec. 16, 2004 and incorporated herein by reference, discloses the benefits of a Digital Geophone System. Smith notes that one problem associated with traditional geophone systems is noise immunity. For longer distances the geophone signal must be amplified and retransmitted. This concatenation of cable and amplifiers adds system noise to the original seismic signal thus decreasing the overall signal to noise ratio of the geophone. Smith attempts to overcome these problems by using a digital geophone. However one problem with this approach is the power required to support the proposed digital geophone of Smith.

Hagedoorn, U.S. Pat. No. 7,518,954, issued Apr. 14, 2009 and incorporated herein by reference, discloses a geophone with an internal cavity that houses an electronic circuit, mainly to accommodate an amplifier plus other electronics. As illustrated in the Figures of that Patent, it can be seen that the geophone transducers were mainly used in machine health type application. In some of these applications, a power cable is required to supply the electronics, but it is not the ideal situation. To mount a transducer on a rotating armature makes it hard to connect a wire, so in other applications, a battery (and some means to recharge) is applied. For battery-powered geophone applications, lower power consumption is desirable.

The limitations of the moving coil geophone recording system are largely in the data acquisition electronics and traditionally, the acceleration signal created by a geophone is converted to a voltage. Measuring voltage was beneficial when building an array of geophones in order to cancel the ground roll and to sum (amplify) reflected source signals.

In A. S. Badger, A. D. Beecroft, A. Stienstra, "Seismic data recording: the limiting component", SEG conference (1990), incorporated herein by reference, Dr Badger writes that the Geophone dynamic range is limited at one end by physics (Brownian motion) and by mechanics at the other (the spring may add a large horizontal signal which distorts the overall signal). Therefore the dynamic range of a moving coil device without a damping resistor is ~140 dB.

Also it should be noted that the geophone collects data from its resonant frequency up to the point where mechanical limitations start to set in. Therefore by removing a damping resistor the benefits may be twofold. One may eliminate certain thermal (Johnson) noise and one may control the resonant frequency via the feedback current. This allows the moving coil sensor to lower the bandwidth to 1-2 Hz, expanding the recordable bandwidth plus getting the sub-10 Hz signal that the oil exploration industry may be interested in. It is believed that Schlumberger, among others, have implemented the moving coil geophone accelerometer and have proven its benefits. One problem with these systems, however, involves acquiring data at ultra-low power while maintaining the fidelity of the sensor. By controlling the resonant frequency, one may be able to record down to 1-2 Hz and one can increase the spring tension to build a 28 Hz geophone, increasing the fidelity at higher frequency and allowing the phone to be put, for example, in a shear wave topology.

Electrical current produced by a moving coil geophone is very small (e.g. substantially 3.3 mA or less) and thus need to be amplified in traditional data acquisition circuits. In traditional data acquisition circuits, a programmable gain amplifier is used typically to amplify the geophone signals. The programmable gain amplifier demands power from the power supply, which in a geophone installation could be a battery or a long cable. It would be desirable to eliminate the programmable gain amplifier from a geophone instrumentation design in order to reduce power consumption. It would also be desirable to address one or more other shortcomings referenced here, each of which is by way of example only.

SUMMARY

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

In one embodiment, a low power analog-to-digital converter senses current output of a geophone instead of voltage. The output of the geophone may be terminated through a resistor into a virtual ground of an integrator located inside a current-mode delta-sigma analog-to-digital converter. The integrator may have either a current-mode or a charge-mode feedback. Thus, the geophone experiences constant or substantially consistent impedance terminated into a virtual ground.

This representative approach can eliminate an instrumentation amplifier from a geophone sensing circuit, while still allowing for accurate sensing of geophone signals. The instrumentation amplifier is a major current consumer from the signal path, so its elimination reduces power consumption. The instrumentation amplifier may be eliminated, at least in a representative embodiment, because of the provision of the resistance into a virtual ground of an integrator of the delta-sigma ADC.

In some embodiments, there may be a tradeoff issue concerning noise versus power. By using a current input, the impedance seen by a sensor may be set by an external resistor (series), which is the user's choice. The user may thus select this resistance to achieve lower power consumption, lower noise levels, or an optimized compromise between the two. A low power (e.g., approximately 10 mW or less) analog-to-digital converter may utilize power in the device in the most optimal way. In general the fewer stages, resistors, and other components, the lower the overall power consumption.

While described in the context for use with a geophone, the low power analog-to-digital converter may be utilized in other applications where low power (e.g., substantially 10 mW or less), low-voltage (e.g., substantially 3 V or less) and low-current (e.g., substantially 3.3 mA or less) signals need to be converted to digital form. Such applications include, but are not limited to sensing devices for automotive and aerospace uses, as well as telecommunications devices and portable electronic devices.

A low power analog-to-digital converter sensing low power sensor signals may comprise an integrator including an amplifier and a feedback capacitor, configured to provide a virtual ground input receiving an input current signal from a sensor, and a feedback digital to analog converter configured to be responsive to integrator output and coupled to a virtual ground. The integrator may comprise a sigma-delta analog-to-digital converter configured to convert the input current signal into a digital output signal.

In one embodiment, the sigma-delta analog-to-digital converter may include a first input operational amplifier, having a first input coupled to ground, and a second input configured to receive the input current signal, the first operational amplifier having an output coupled to the second input of the first operational amplifier to provide a virtual ground at the input current signal, providing a substantially constant impedance terminated into the virtual ground. An input resistor may be configured to pass the input current signal from a sensor.

In one embodiment, the input current signal may comprise a first input current signal and a second input current signal, and the integrator is configured to convert a difference between the first input current signal and the second input current signal into a digital output signal. The integrator may include a sigma-delta analog-to-digital converter including a second input operational amplifier, having a first input of the second operational amplifier coupled to ground, and a second input of the second operational amplifier coupled to the second input current signal, the operational amplifier having an output coupled to the second input of the operational amplifier to provide a virtual ground at the second input current signal, providing a substantially constant impedance terminated into the virtual ground.

In one embodiment, a quantizer coupled to the sigma-delta digital-to-analog converter, may be configured to quantize the digital output signal, such that the feedback digital-to-analog converter is coupled to the quantizer and the second input of the first operational amplifier, and is configured to receive the quantized digital output signal and output an analog feedback signal to the second input of the first operational amplifier, and is configured to reduce sensitivity of the low power analog-to-digital converter to jitter in clock output. In one embodiment, the digital-to-analog converter comprises a current-mode digital-to-analog converter.

In one embodiment, the digital-to-analog converter comprises a charge-mode digital-to-analog converter, configured to reduce transient behavior of signals from the sensor into the virtual ground. A quantizer may be coupled to the sigma-delta digital-to-analog converter, configured to quantize the digital output signal and a feedback digital-to-analog converter, coupled to the quantizer and the second input of the first operational amplifier and the second input of the second operational amplifier, and may be configured to receive the quantized digital output signal and output an analog feedback signal to the second input of the first operational amplifier and the second input of the second operational amplifier, and may be configured to reduce sensitivity of the low power analog-to-digital converter less sensitive to jitter in clock output.

In one embodiment, the low power analog-to-digital converter comprises a current mode digital-to-analog converter. The digital-to-analog converter may comprise a charge mode digital-to-analog converter configured to reduce transient behavior of signals from the sensor into the virtual ground.

In one embodiment, the sensor may comprise a geophone, outputting a low power signal. The sigma-delta analog-to-digital converter is coupled to the input current signal without an instrumentation amplifier configured to amplify the first current input signal.

BRIEF DESCRIPTION OF THE DRAWINGS

FIG. 3 is a schematic diagram of the second embodiment of a power analog-to-digital converter of FIG. 1b, incorporating the delta-signam modulator low power analog-to-digital converter of FIG. 2a.

DETAILED DESCRIPTION

In reference to FIGS. 1a, 1b, 1c, 2a, and 2b, at least the following steps may be performed in conjunction with methods or implementations according to different embodiments of the present disclosure. Additionally, or alternatively, steps such as those listed below may be incorporated into corresponding apparatuses or systems according to other embodiments of this disclosure.

Figure 1A:
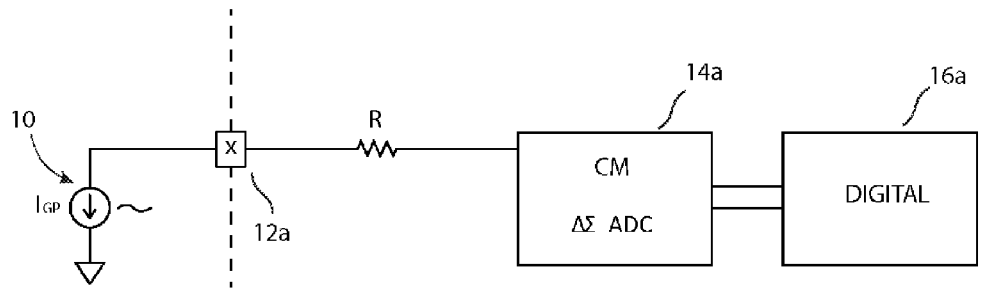
FIG. 1a is a schematic diagram of a first embodiment of a low power analog-to-digital converter, in accordance with the embodiments of this disclosure.

FIG. 1a is a schematic diagram of a first embodiment of a low power analog-to-digital converter using a single-ended implementation architecture. In the embodiment of FIG. 1a, resistance from resistor R is provided in line into a virtual ground of an integrator of a current-mode delta-sigma analog to digital converter 14a.

Resistor R may be split internally and externally to the current-mode delta-sigma analog to digital converter 14a, and thus may represent the combination of internal and external resistances. For all of the embodiments described herein, the series resistor R may represent any combination of resistances, internal and external to the integrated circuit as would be understood by those of ordinary skill in the art. For example, resistance R may represent a combination of an internal resistance of 100 ohms and an external resistance of 900 ohms in one application. In another application no external resistance may be present, thus providing different overall impedance.

Referring to FIG. 1a, a geophone, or other low power output instrument or sensor is shown as element 10, outputting a variable current signal in response to vibrations or movement of the earth. The term "low power" as used in the present application, refers to instruments and components outputting low power signals and/or have low power usage requirements, on the order of 10 mW or less. In a geophone application, the output signal from the geophone is a low voltage, low power signal. In addition, since such instruments may be remotely located or battery powered, they may have lower power consumption requirements as well. However, it should be understood that the present invention may be applied to other types of instruments where energy savings or other features of the invention as described herein are advantageous.

Current output $I_{GP}$ of the device is measured at output terminal 12a, which may be a terminal present on sensor packaging or wire leads from a sensor or the like. Another terminal of the geophone or other low power output instrument or sensor 10 may be grounded. The dashed line in FIGS. 1a, 1b, 2a, and 2c represents a boundary between geophone or other low power output instrument or sensor 10 and an integrated circuit housing a low power analog-to-digital converter, in the one embodiment. In some embodiments the elements of the low power analog-to-digital converter may be provided as discrete components or the package may be integrated into a geophone or other instrumentation device. Other arrangements or configurations may also be apparent to one of ordinary skill in the art having the benefit of the present disclosure.

Current-mode delta-sigma analog to digital converter 14a measures the current output $I_{GP}$ produced by the geophone or other instrument and then outputs a digital signal indicative of this current output. This digital signal, which may be representative of earth vibrations or movement, or other signal types, may then be communicated to a digital circuit 16a for data logging, analysis, alarm functions, or other uses commonly known for such geophone or other sensor data.

Traditionally geophone sensors measured voltage at the geophone, rather than current. As the signal is a very low power signal, it may tend to be noisy and difficult to measure, as the sensor needs to detect small variations in voltage. Output terminal 12a of geophone or other low power output instrument or sensor 10 may be terminated through resistor R in FIG. 1a into a virtual ground of an integrator (such as described below in connection with FIG. 1c) located inside the current mode delta-sigma analog-to-digital converter 14a. The integrator within the current-mode delta-sigma analog to digital converter 14a may have either a current-mode or a charge-mode feedback. The geophone experiences constant or substantially constant (e.g., within measurable limits) impedance, terminated into a virtual ground.

Figure 1B:
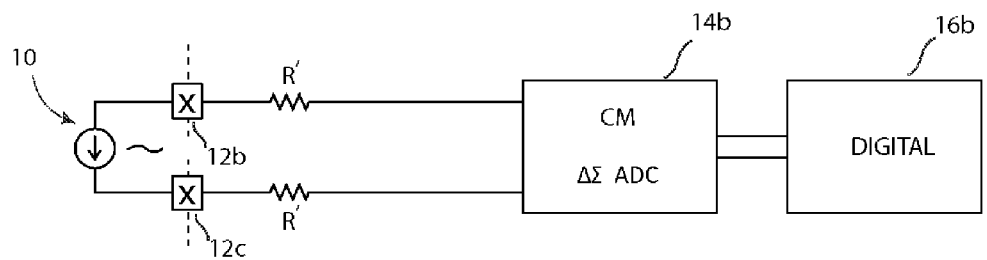
FIG. 1b is a schematic diagram of a second embodiment of a power analog-to-digital converter, in accordance with the embodiments of this disclosure.
Figure 1C:
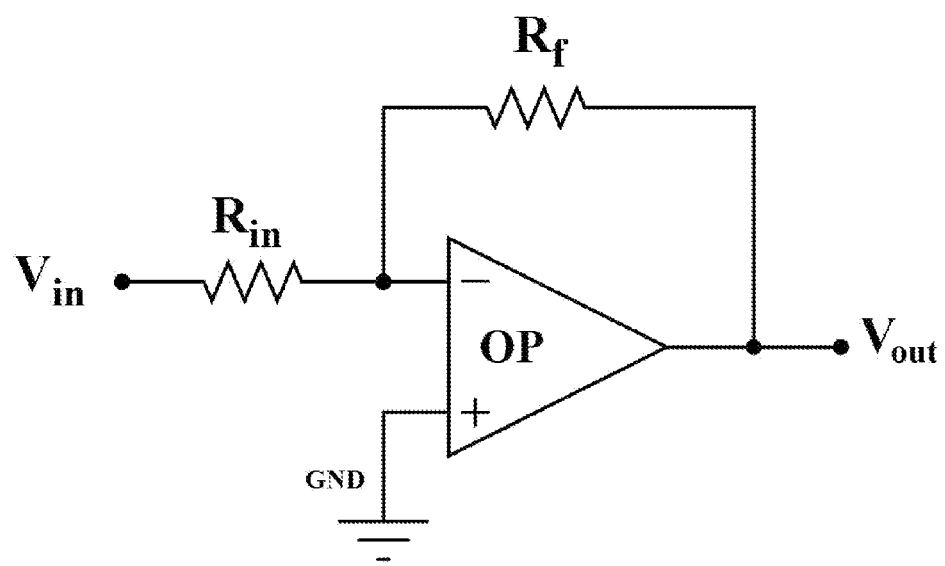
FIG. 1c is a simplified schematic of a virtual ground as used with an OpAmp circuit in the prior art.

FIG. 1c is a simplified schematic of a virtual ground as used with an operational amplifier OP as known in the prior art. The term "virtual ground" generally refers to a node of a circuit that is maintained at a steady reference potential, without being connected directly to the reference potential. In some cases the reference potential is considered to be that of the surface of the earth, and the reference node is called "ground" or "earth" as a consequence. The virtual ground concept aids circuit analysis in operational amplifier and other circuits and provides useful practical circuit effects that would be difficult to achieve in other ways.

Traditionally, a voltage divider, using two resistors, can be used to create a virtual ground node. If two voltage sources are connected in series with two resistors, it can be shown that the midpoint becomes a virtual ground if:

$$\frac{V_2}{V_1} = -\frac{R_2}{R_1} \tag{1}$$

An active virtual ground circuit is sometimes called a rail splitter. Such a circuit uses an operational amplifier OP or some other circuit element that has gain, as illustrated in FIG. 1c. An input voltage signal $V_{in}$ is fed to the operational amplifier OP through input resistor $R_{in}$. Since operational amplifier OP has very high open-loop gain, the potential difference between its inputs (+) and (−) tend to zero when a feedback network is implemented. To achieve a reasonable output voltage $V_{out}$ at the output (and thus equilibrium in the system), the output voltage $V_{out}$ supplies the inverting input (via a feedback network, resistor $R_f$) with enough voltage to reduce the potential difference between the inputs to microvolts. The non-inverting (+) input of operational amplifier OP is grounded to ground GND. Therefore, its inverting (−) input, although not connected to ground GND, will assume a similar potential, becoming a virtual ground.

The embodiments of FIGS. 1a and 1b, described below, may employ an operational amplifier in a virtual ground configuration to sense current from a geophone. In other embodiments, as will be described in FIGS. 2a and 2b, a modified version of the virtual ground may be employed.

FIG. 1b is a schematic diagram of a second embodiment of a low power analog-to-digital converter using a differential implementation architecture. FIG. 1b shows resistances from resistors R' may be provided in line to virtual ground(s) of an integrator through differential inputs of the current mode delta-sigma analog to digital converter 14b.

Referring to FIG. 1b, a geophone, or other low power output instrument or sensor is shown as element 10, outputting a variable current signal in response to vibrations or movement of the earth. Current output of geophone or other low power output instrument or sensor 10 is measured at output terminals 12b and 12c of geophone or other low power output instrument or sensor 10, which may be a terminal present on a sensor packaging or wire leads from a sensor or the like.

Output terminals 12b, 12c of geophone or other low power output instrument or sensor 10 may be connected through resistors R' in FIG. 1b into a virtual ground of one or more integrators (such as described previously in connection with FIG. 1c) located inside the current-mode delta-sigma analog to digital converter 14b The one or more integrators within current mode delta-sigma analog to digital converter 14b may have either a current-mode or a charge-mode feedback. The geophone experiences constant or substantially constant impedance terminated into a virtual ground.

Current mode delta-sigma analog to digital converter 14b senses current output from terminals 12b and 12c of geophone or other sensor, instead of voltage as in the prior art. The output of the geophone may be terminated through resistors R' into virtual ground(s) of an integrator inside the current mode delta-sigma analog to digital converter 14b. The integrator may have either a current-mode or a charge mode-feedback. A charge-mode feedback may be provided by a switched-capacitor feedback mechanism, operating at a sampling rate. The effect is equivalent to current feedback. The geophone experiences constant or substantially constant impedance terminated into a virtual ground.

Current-mode delta-signal analog to digital converter 14b measures the current output $I_{GP}$ produced by the geophone or other instrument and then outputs a digital signal indicative of this current output. This digital signal, which may be representative of earth vibrations or movement, or other signal types, may then be communicated to a digital circuit 16b for data logging, analysis, alarm functions, or other uses commonly known for such geophone or other sensor data.

Figure 2A:
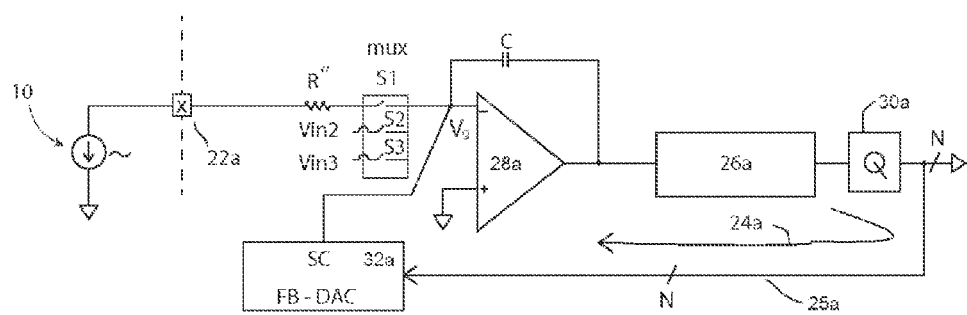
FIG. 2a is a schematic diagram of a third embodiment of a low power analog-to-digital converter, in accordance with the embodiments of this disclosure.

FIG. 2a is a schematic diagram of a third embodiment of a low power analog-to-digital converter, showing an example of a low power analog to digital converter implementation for sensing geophone signals. The feedback path in the embodiment of FIG. 2a is implemented in a charge-mode and shows a charge-mode feedback path 24a.

Referring to FIG. 2a, current from geophone or other low power output instrument or sensor 10 is sensed at current output terminal 22a, instead of the voltage. The output of the geophone may be terminated through a resistor R" into a virtual ground Vg of the operational amplifier integrator 28a located within the charge mode delta-sigma analog to digital converter. Operational amplifier integrator 28a in this embodiment has a charge-mode feedback. The geophone or other low power output instrument or sensor 10 experiences constant or substantially constant impedance terminated into a virtual ground Vg.

The resistance from resistor R" is provided in line from current output terminal 22a to virtual ground Vg of operational amplifier integrator 28a. Operational amplifier integrator 28a may use a feedback circuit comprising capacitor C, in order to provide virtual ground Vg. A MUX S1 may be provided to switch the input signal from geophone or other low power output instrument or sensor 10 to other inputs in2 and in3 and the like, for calibration purposes. MUX S1 may also be used to connect to other geophones or sensors, in order to selectively measure signals from different sensors, for example, in a geophone array.

One purpose for using a MUX in a seismic recording system is to disconnect the sensor so the data acquisition system and the sensor can be tested. Some sensor manufacturers have experimented with testing the sensor and the signal processing hardware (e.g., amplifier, analog-to-digital converter, signal filter, and the like) all at the same time. However, providing a MUX in the design may provide the user with both options—testing the sensor by itself, or in conjunction with the signal processing hardware. Using a MUX for multiple sensors may not be as feasible for seismic exploration but may be useful for monitoring machine health, or other applications. Embodiments of low power analog-to-digital converters may integrate the ADC with the sensor, thus creating a "smart sensor" that operates using low power while still maintaining and verifying required dynamic range (low noise and distortion) for most common applications.

Output of operational amplifier integrator 28a may be communicated to additional integrator(s) 26a whose output is then communicated to quantizer 30a. Output 25a of quantizer 30a, having N bits, may be communicated to charge-mode feedback digital to analog converter 32a, which in turn provides an input to operational amplifier integrator 28a.

A charge-mode feedback digital to analog converter 32a may make the system less sensitive to jitter in clock output but may introduce a transient behavior into the virtual ground Vg. This jitter problem may be solved such as taught and disclosed in Melanson, U.S. Pat. No. 5,896,101, issued Apr. 20, 1999, entitled "Wide Dynamic Range Delta Sigma A/D Converter" and incorporated herein by reference.

Figure 2B:
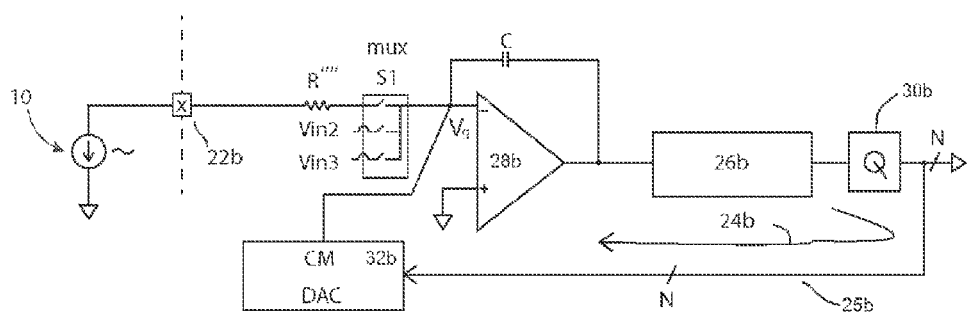
FIG. 2b is a schematic diagram of a fourth embodiment of a low power analog-to-digital converter, in accordance with the embodiments of this disclosure.

FIG. 2b is a schematic diagram of a fourth embodiment of a low power analog-to-digital converter, showing an example of a low power ADC implementation for sensing geophone signals. FIG. 2b shows an example implementation in current-mode and shows a current-mode feedback path 24b. Resistance from resistor R"" is provided in line into virtual ground Vg of the operational amplifier integrator 28b. The use of a current mode feedback DAC may circumvent the above-mentioned problem with respect to transient behavior in the virtual ground. For example, a multi-bit quantizer and filtering techniques may be used to solve any jitter related artifacts as well.

Referring to FIG. 2b, current from geophone or other low power output instrument or sensor 10 is sensed at current output terminal 22b, instead of the voltage. The output of the geophone may be terminated through a resistor R" into a virtual ground Vg of the operational amplifier integrator 28b located within a current-mode delta-sigma analog to digital converter. Operational Amplifier integrator 28b in this embodiment has a current-mode feedback. Geophone or other low power output instrument or sensor 10 experiences constant or substantially constant impedance terminated into a virtual ground Vg.

The resistance from resistor R" is provided in line from current output terminal 22*b* to virtual ground Vg of the operational amplifier integrator 28*b*. Operational amplifier integrator 28*b* may use a feedback circuit comprising capacitor C, in order to provide virtual ground Vg. A MUX S1 may be provided as in FIG. 2*a*.

Output of operational amplifier integrator 28*b* may be communicated to additional integrator(s) 26*b*, whose output is then communicated to quantizer 30*b*. Output 25*b* of quantizer 30*b*, having N bits, may be fed to current-mode feedback digital to analog converter 32*b*, which in turn provides an input to operational amplifier integrator 28*b*.

A current-mode feedback digital to analog converter 32*b* may make the system less sensitive to jitter in clock output and may also reduce the transient behavior into the virtual ground Vg, as may be experienced with the charge-mode feedback digital to analog converter 32*a* of FIG. 2*a*.

Figure 3:
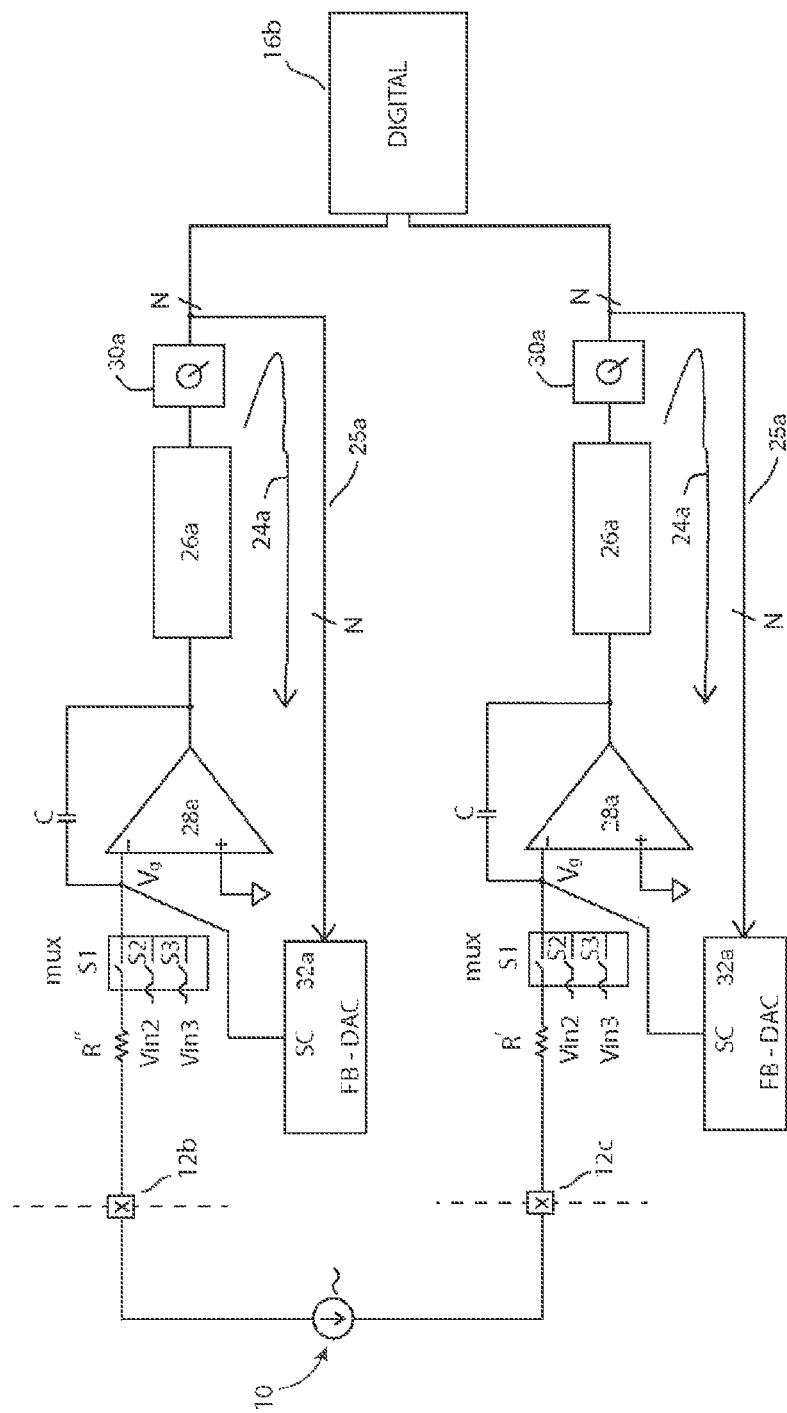
Figure 4:
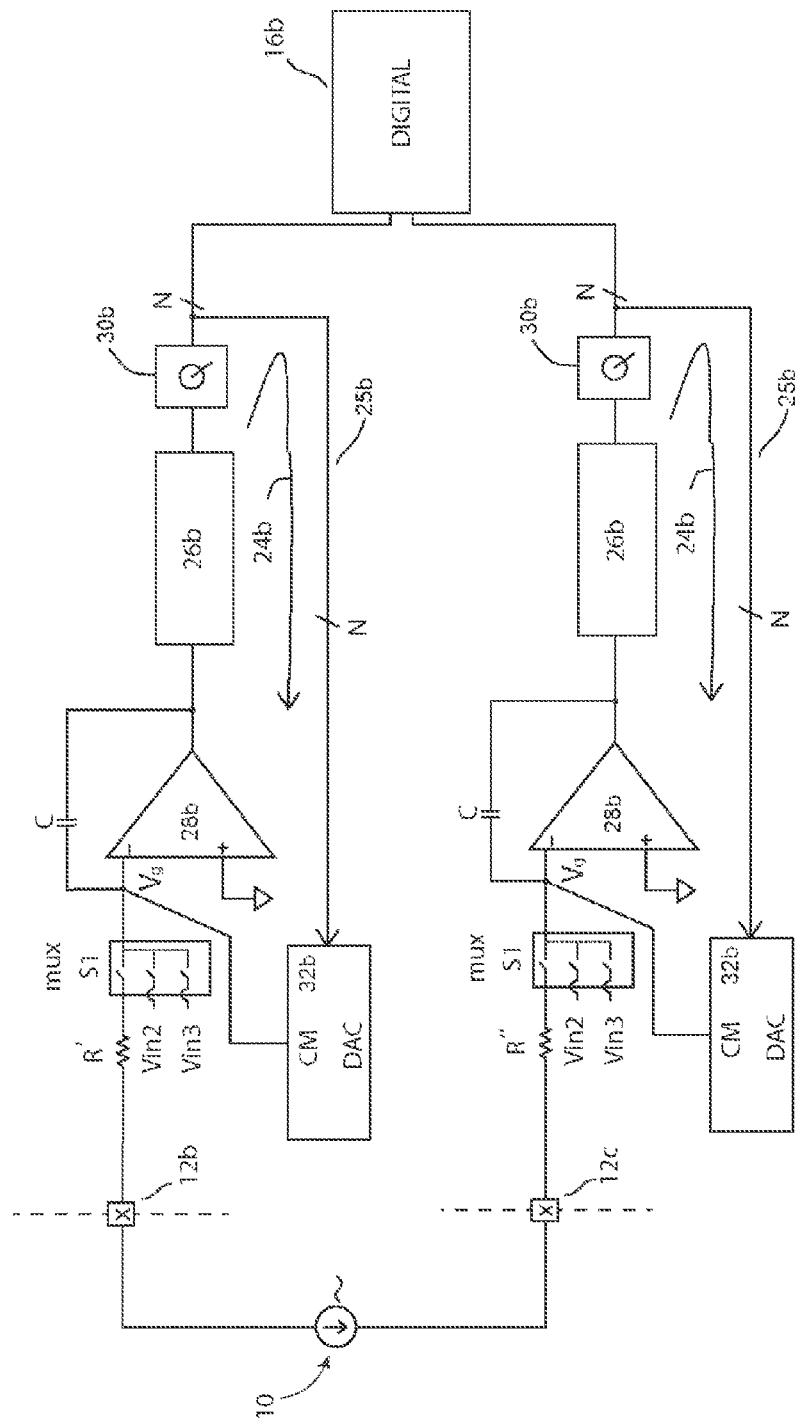
FIG. 4 is a schematic diagram of the second embodiment of a power analog-to-digital converter of FIG. 1b, incorporating the delta-signam modulator low power analog-to-digital converter of FIG. 2b.

The architecture proposed in FIGS. 2*a* and 2*b* may be achieved in different manners. For example it may be achieved through a differential implementation, such as that described in FIG. 1*b* and as illustrated in FIGS. 3 and 4. The representative approach of a low power analog-to-digital converter may eliminate the need for an instrumentation amplifier, while still allowing for sensing of geophone signals.

The instrumentation amplifier is a major current consumer from the signal path, so its elimination reduces power consumption. The instrumentation amplifier may be eliminated, at least in a representative embodiment, due at least in part to the provision of the resistance into a virtual ground of an integrator of the delta-sigma ADC.

Further embodiments likewise, with the benefit of this disclosure, will be apparent to those having ordinary skill in the art, and such embodiments should be deemed as being encompassed herein. While certain embodiments have been disclosed and described in detail herein, it may be apparent to those having ordinary skill in the art that various changes in form and detail may be made therein without departing from the spirit and scope of this disclosure.

We claim:

1. A low power analog-to-digital converter configured to sense sensor signals, comprising:
   an integrator including an amplifier and a feedback capacitor, the integrator configured to provide a virtual ground input receiving an input current signal from a sensor; and
   a feedback digital to analog converter configured to be responsive to integrator output and coupled to the virtual ground,
   wherein the sensor comprises a geophone, outputting a low power signal.

2. The low power analog-to-digital converter of claim 1, wherein the integrator comprises a sigma-delta analog-to-digital converter configured to convert the input current signal into a digital output signal.

3. The low power analog-to-digital converter of claim 2, wherein the sigma-delta analog-to-digital converter includes a first operational amplifier, having a first input of the first operational amplifier coupled to ground, and a second input of the first operational amplifier configured to receive the input current signal, the first operational amplifier having an output coupled to the second input of the first operational amplifier to provide a virtual ground at the input current signal providing a substantially constant impedance terminated into the virtual ground.

4. The low power analog-to-digital converter of claim 3, wherein the input current signal comprises a first input current signal and a second input current signal, and the integrator is configured to convert a difference between the first input current signal and the second input current signal into a digital output signal.

5. The low power analog-to-digital converter of claim 4 wherein the integrator includes a sigma-delta analog-to-digital converter including a second operational amplifier, having a first input of the second operational amplifier coupled to ground, and a second input of the second operational amplifier coupled to the second input current signal, the second operational amplifier having an output coupled to the second input of the second operational amplifier to provide a virtual ground at the second input current signal, providing a substantially constant impedance terminated into the virtual ground.

6. The low power analog-to-digital converter of claim 5, further comprising:
   a quantizer, coupled to the sigma-delta digital-to-analog converter, configured to quantize the digital output signal;
   a feedback digital-to-analog converter, coupled to the quantizer and the second input of the second operational amplifier, configured to receive the quantized digital output signal and output an analog feedback signal to the second input of the second operational amplifier, and configured to reduce sensitivity of the low power analog-to-digital converter to jitter in clock output.

7. The low power analog-to-digital converter of claim 6, wherein the digital-to-analog converter comprises a current mode digital-to-analog converter.

8. The low power analog-to-digital converter of claim 6, wherein the digital-to-analog converter comprises a charge mode digital-to-analog converter configured to reduce transient behavior of signals from the sensor into the virtual ground.

9. The low power analog-to-digital converter of claim 3, further comprising:
   a quantizer, coupled to the sigma-delta digital-to-analog converter, configured to quantize the digital output signal;
   wherein the feedback digital-to-analog converter is coupled to the quantizer and the second input of the first operational amplifier, and is configured to receiving the quantized digital output signal and output an analog feedback signal to the second input of the first operational amplifier, and is configured to reduce sensitivity of the low power analog-to-digital converter to jitter in clock output.

10. The low power analog-to-digital converter of claim 3, wherein the sigma-delta analog-to-digital converter is coupled to the input current signal without an instrumentation amplifier configured to amplify the first current input signal.

11. The low power analog-to-digital converter of claim 1, further comprising an input resistor, configured to pass the input current signal from a sensor.

12. The low power analog-to-digital converter of claim 1, wherein the digital-to-analog converter comprises a current-mode digital-to-analog converter.

13. The low power analog-to-digital converter of claim 1, wherein the digital-to-analog converter comprises a charge-mode digital-to-analog converter, configured to reduce transient behavior of signals from the sensor into the virtual ground.

14. A method for sensing sensor signals, comprising:
   receiving an input current signal from a sensor in an integrator including an amplifier and a feedback capacitor providing a virtual ground input and outputting a digital output; and feeding back the digital output through a feedback digital to analog converter responsive to integrator output and coupled to the virtual ground, wherein the sensor comprises a geophone, outputting a low power signal.

15. The method of claim 14, wherein the integrator comprises a sigma-delta analog-to-digital converter converting the input current signal into a digital output signal.

16. The method of claim 15, wherein the virtual ground is provided by the sigma-delta analog-to-digital converter including a first operational amplifier, having a first input of the first operational amplifier coupled to ground, and a second input of the first operational amplifier receiving the input current signal, the first operational amplifier having an output coupled to the second input of the first operational amplifier to provide a virtual ground at the input current signal providing a substantially constant impedance terminated into the virtual ground.

17. The method of claim 16, wherein the sigma-delta analog-to-digital converter is coupled to the input current signal without an instrumentation amplifier first amplifying the first current input signal.

18. The method of claim 14, further comprising passing the input current signal from a sensor through an input resistor.

19. The method of claim 18, wherein the input current signal comprises a first input current signal and a second input current signal, and the method further comprises:

converting, in the integrator, a difference between the first input current signal and the second input current signal into a digital output signal.

20. The method of claim 19 wherein providing a virtual ground comprises including in the integrator a second operational amplifier, having a first input of the second operational amplifier coupled to ground, and a second input of the second operational amplifier coupled to the second input current signal, the second operational amplifier having an output coupled to the second input of the second operational amplifier to provide a virtual ground at the second input current signal, providing a substantially constant impedance terminated into the virtual ground.

21. The method of claim 20, further comprising:

quantizing the digital output signal in a quantizer, coupled to the sigma-delta digital-to-analog converter;

a feedback digital-to-analog converter, coupled to the quantizer and the second input of the second operational amplifier, receiving the quantized digital output signal and outputting an analog feedback signal to the second input of the second operational amplifier, reducing sensitivity to jitter in clock output.

22. The method of claim 21, wherein the digital-to-analog converter comprises a current mode digital-to-analog converter.

23. The method of claim 21, wherein the digital-to-analog converter comprises a charge mode digital-to-analog converter, reducing transient behavior of signals from the sensor into the virtual ground.

24. The method of claim 18, further comprising:

quantizing the digital output signal in a quantizer, coupled to the sigma-delta digital-to-analog converter;

wherein the feedback digital-to-analog converter is coupled to the quantizer and the second input of the first operational amplifier, receiving the quantized digital output signal and outputting an analog feedback signal to the second input of the first operational amplifier, reducing sensitivity to jitter in clock output.

25. The method of claim 14, wherein the digital-to-analog converter comprises a current-mode digital-to-analog converter.

26. The method of claim 14, wherein the digital-to-analog converter comprises a charge-mode digital-to-analog converter, reducing transient behavior of signals from the sensor into the virtual ground.

* * * * *